United States Patent
Bai

(10) Patent No.: US 9,214,619 B2
(45) Date of Patent: Dec. 15, 2015

(54) METHOD OF IMPROVING ENERGY CONSUMPTION EFFICIENCY AND MOBILE TERMINAL THEREOF, AND USE OF THERMO-ELECTRIC CONVERSION MODULE

(75) Inventor: Jian Bai, Guangdong Province (CN)

(73) Assignee: HUIZHOU TCL MOBILE COMMUNICATION CO., LTD., Huizhou, Guangdong Province (CN)

(*) Notice: Subject to any disclaimer, the term of this patent is extended or adjusted under 35 U.S.C. 154(b) by 402 days.

(21) Appl. No.: 13/811,385

(22) PCT Filed: Mar. 29, 2011

(86) PCT No.: PCT/CN2011/072236
§ 371 (c)(1),
(2), (4) Date: Jan. 21, 2013

(87) PCT Pub. No.: WO2012/009983
PCT Pub. Date: Jan. 26, 2012

(65) Prior Publication Data
US 2013/0119919 A1    May 16, 2013

(30) Foreign Application Priority Data
Jul. 23, 2010    (CN) .......................... 2010 1 0236797

(51) Int. Cl.
*H02J 7/00* (2006.01)
*H01L 35/32* (2006.01)
*G06F 1/26* (2006.01)
*H04W 52/02* (2009.01)
*G06F 1/20* (2006.01)

(52) U.S. Cl.
CPC .............. *H01L 35/325* (2013.01); *G06F 1/203* (2013.01); *G06F 1/263* (2013.01); *G06F 1/266* (2013.01); *H02J 7/0042* (2013.01); *H04W 52/0209* (2013.01); *Y02B 60/50* (2013.01)

(58) Field of Classification Search
USPC .................................. 320/101, 104, 150, 153
See application file for complete search history.

(56) References Cited

U.S. PATENT DOCUMENTS

| | | | |
|---|---|---|---|
| 6,307,142 B1 | 10/2001 | Allen et al. | |
| 6,570,362 B1 * | 5/2003 | Estes et al. | 320/101 |
| 2003/0143958 A1 * | 7/2003 | Elias et al. | 455/73 |
| 2005/0041397 A1 * | 2/2005 | Alford et al. | 361/720 |

FOREIGN PATENT DOCUMENTS

| | | |
|---|---|---|
| CN | 1708158 A | 12/2005 |
| CN | 1925342 A | 3/2007 |
| CN | 101873082 A | 10/2010 |
| CN | 101931347 A | 12/2010 |
| CN | 201758418 U | 3/2011 |

* cited by examiner

*Primary Examiner* — Paul Dinh
(74) *Attorney, Agent, or Firm* — Cheng-Ju Chiang

(57) ABSTRACT

The present disclosure provides a method of improving the energy consumption efficiency and a mobile terminal thereof, and a use of a thermo-electric conversion module. The method comprises the following steps: A. a power amplifier module electrically connected to a circuit board of the mobile terminal amplifies a communication signal of the mobile terminal to generate heat energy; B. a thermo-electric conversion module, of which an output terminal is electrically connected to the circuit board, absorbs the heat energy generated by the power amplifier module during operation; and C. the thermo-electric conversion module converts the heat energy absorbed into electric power and output the electric power to the circuit board.

5 Claims, 3 Drawing Sheets

METHOD OF IMPROVING ENERGY CONSUMPTION EFFICIENCY AND MOBILE TERMINAL THEREOF, AND USE OF THERMO-ELECTRIC CONVERSION MODULE

CROSS REFERENCE TO RELATED APPLICATIONS

The present application is a 35 U.S.C. §371 National Phase conversion of International (PCT) Patent Application No. PCT/CN2011/072236, filed on Mar. 29, 2011, the disclosure of which is incorporated by reference herein. The PCT International Patent Application was published in Chinese.

FIELD OF THE INVENTION

The present disclosure generally relates to a mobile communication terminal with a power amplifier, a method of using a thermo-electric conversion module to improve the energy consumption efficiency, and a use of the thermo-electric conversion module; and more particularly, the present disclosure relates to a method of improving the energy consumption efficiency and a mobile terminal thereof, and a use of a thermo-electric conversion module.

BACKGROUND OF THE INVENTION

Energy consumption efficiencies of communication terminals currently available are not so high, with most of energy being consumed by power amplifiers (PAs) thereof. Generally, the highest power efficiency of a power amplifier is only about 40% even during emission of signals, which means that about 60% of the electric power is converted into heat energy as a loss.

Taking a Wideband Code Division Multiple Access (WCDMA) terminal as an example, the operating current of the power amplifier at the highest power thereof may go as high as 500~700 mA. After a long time period of talking with the WCDMA terminal, most of the electric power is unnecessarily converted into heat energy due to the low energy consumption efficiency. As a consequence, the WCDMA terminal becomes relatively hot with the temperature thereof going as high as 60° C. or even higher, which has an adverse influence on use of the WCDMA terminal. Furthermore, the high temperature also leads to a potential danger to the battery of the WCDMA terminal.

Accordingly, there is still room for improvement and development of the prior art.

SUMMARY OF THE INVENTION

An objective of the present disclosure is to provide a method of improving the energy consumption efficiency and a mobile terminal thereof, and a use of a thermo-electric conversion module, which can improve the energy consumption efficiency of the mobile communication terminal.

The technical solutions of the present disclosure are as follows.

A method of improving energy consumption efficiency in a mobile terminal, comprising the following steps:

A. a power amplifier module electrically connected to a circuit board of the mobile terminal amplifies a communication signal of the mobile terminal to generate heat energy;

B. a thermo-electric conversion module, of which an output terminal is electrically connected to the circuit board, absorbs the heat energy generated by the power amplifier module during operation; and C. the thermo-electric conversion module converts the heat energy absorbed into electric power and output the electric power to the circuit board.

Preferably, the step C further comprises an operation of detecting the temperature as follows:

C1. detecting a temperature value of a high-temperature end of the thermo-electric conversion module and that of a low-temperature end of the thermo-electric conversion module respectively;

C2. determining a temperature difference value between the temperature value of the high-temperature end and the temperature value of the low-temperature end; and C3. introducing a voltage of the output terminal of the thermo-electric conversion module when the temperature difference value reaches a preset temperature difference threshold.

Preferably, the step C further comprises:

C4. detecting a voltage value of the output terminal of the thermo-electric conversion module;

C5. comparing the detected voltage value with a preset voltage threshold; and

C6. introducing the voltage of the output terminal of the thermo-electric conversion module when the detected voltage value reaches the preset voltage threshold.

Preferably, the output terminal of the thermo-electric conversion module is electrically connected to a recharging circuit of the circuit board to recharge a battery of the mobile terminal.

Preferably, the output terminal of the thermo-electric conversion module is electrically connected to a power supply circuit on the circuit board to power a power-consuming module of the mobile terminal.

A mobile terminal with improved energy consumption efficiency, comprising a circuit board and at least one power amplifier module electrically connected to the circuit board to amplify a communication signal of the mobile terminal, wherein the mobile terminal is further provided with a thermo-electric conversion module for absorbing heat energy generated by the power amplifier module and converting the heat energy into electric power, and an output terminal of the thermo-electric conversion module is electrically connected to the circuit board.

Preferably, the high-temperature end of the thermo-electric conversion module is located at a back surface of the circuit board and opposite to the power amplifier, and the power amplifier is located at a front surface of the circuit board.

Preferably, the high-temperature end of the thermo-electric conversion module is disposed close to the power amplifier module, and the heat energy generated by the power amplifier module during operation is directly absorbed through heat conduction.

Preferably, the output terminal of the thermo-electric conversion module is electrically connected to a recharging circuit of the circuit board to recharge a battery of the mobile terminal.

Preferably, the output terminal of the thermo-electric conversion module is electrically connected to a power supply circuit on the circuit board to power a light emitting diode (LED) lamp of the mobile terminal.

Preferably, the output terminal of the thermo-electric conversion module is electrically connected to a power supply circuit on the circuit board to power a display panel of the mobile terminal.

Preferably, the thermo-electric conversion module is a thermo-electric conversion sheet that matches a layout of the power amplifier.

Preferably, the thermo-electric conversion module is formed by connecting multiple PN junctions in series.

A use of a thermo-electric conversion module, wherein the thermo-electric conversion module is disposed inside a mobile terminal to absorb heat energy generated by a power amplifier of the mobile terminal when amplifying a communication signal; and an output terminal of the thermo-electric conversion module is electrically connected to a circuit board of the mobile terminal to output electric power obtained through conversion to a recharging circuit or a power-consuming module of the mobile terminal.

According to the method of improving energy consumption efficiency and the mobile terminal thereof and the use of a thermo-electric conversion module of the present disclosure, the thermo-electric conversion module is used in the mobile terminal to absorb heat energy generated during operation of the power amplifier and to convert the heat energy into electric power, so the energy consumption efficiency of the mobile terminal is improved; and meanwhile, this also reduces the temperature rise of the mobile terminal after a long period of talking, reduces the impact of the high temperature on use of the mobile terminal, and improves the safety of the battery of the mobile terminal.

BRIEF DESCRIPTION OF THE DRAWINGS

To describe the technical solutions of embodiments of the present disclosure more clearly, the attached drawings necessary for description of the embodiments will be introduced briefly hereinbelow. Obviously, these attached drawings only illustrate some of the embodiments of the present disclosure, and those of ordinary skill in the art can further obtain other attached drawings according to these attached drawings without making inventive efforts. In the attached drawings.

DETAILED DESCRIPTION OF THE INVENTION

Hereinbelow, the present disclosure will be further described with reference to the attached drawings and embodiments thereof.

Figure 1:
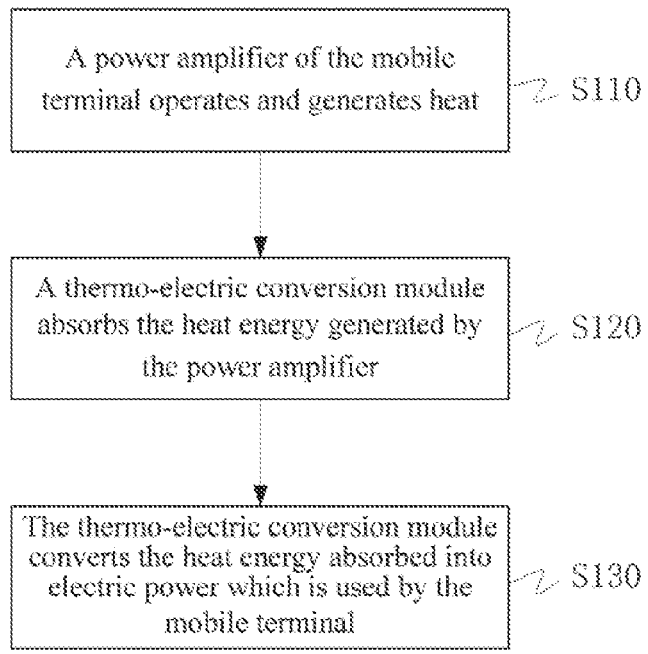
FIG. 1 is a flowchart diagram of a method of improving energy consumption efficiency in a mobile terminal according to the present disclosure.

The present disclosure provides a method of improving energy consumption efficiency in a mobile terminal. As shown in FIG. 1, one of implementations of the method comprises the following steps:

step S110: a power amplifier for amplifying a communication signal is disposed on a circuit board inside the mobile terminal, and is electrically connected to the circuit board; and the power amplifier generates heat energy during operation (e.g., in the process of using the mobile terminal for communication, the power amplifier amplifies a transmitted communication signal and/or a received communication signal during operation, and generates a great deal of heat energy during operation);

step S120: a thermo-electric conversion module disposed inside the mobile terminal absorbs, through heat conduction, the heat energy generated by the power amplifier during operation; and the heat energy is absorbed directly and/or indirectly in manners including heat conduction, heat convection and heat radiation;

step S130: the thermo-electric conversion module converts the heat energy absorbed into electric power and outputs the electric power to the circuit board.

Figure 2:
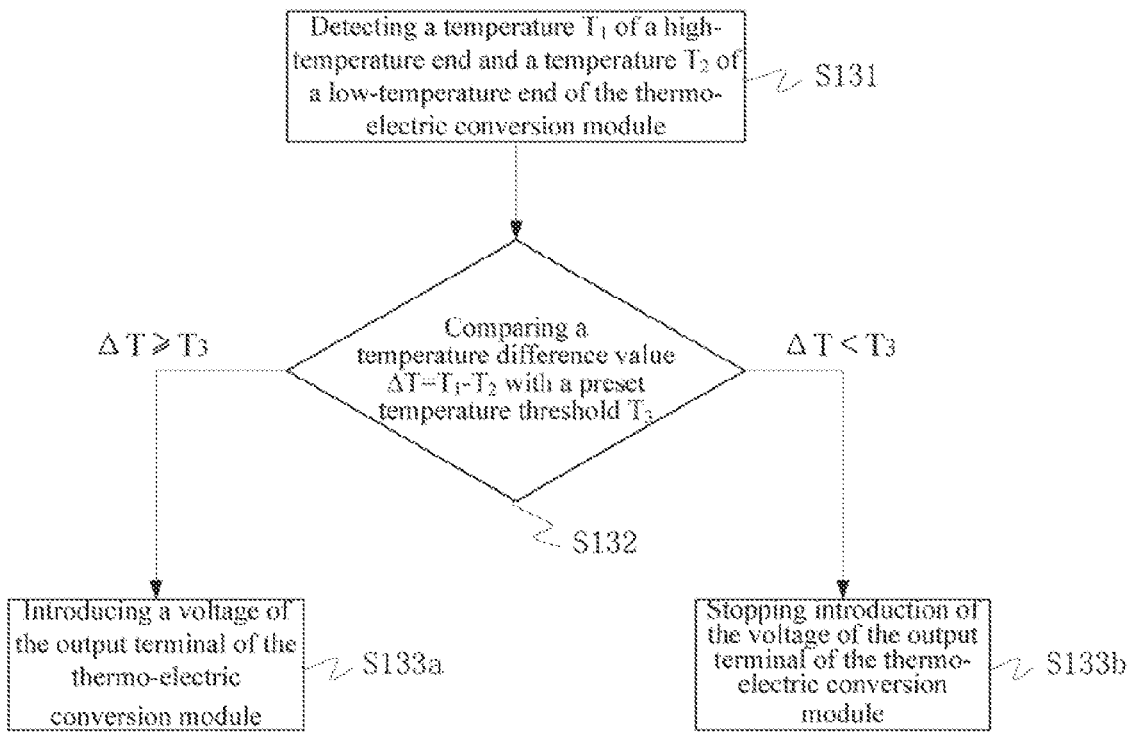
FIG. 2 is a flowchart diagram of detecting the temperature in the method of improving energy consumption efficiency in a mobile terminal according to the present disclosure.

The step S130 may further comprise operations of temperature detection and/or voltage detection as follows:

(1) Temperature Detection as Shown in FIG. 2 step S131: detecting a temperature value $T_1$ of a high-temperature end of the thermo-electric conversion module and a temperature value $T_2$ of a low-temperature end of the thermo-electric conversion module respectively;

step S132: comparing a temperature difference value $\Delta T = T_1 - T_2$ between the temperature value $T_1$ of the high-temperature end and the temperature value $T_2$ of the low-temperature end with a preset temperature difference threshold $T_3$;

when the temperature difference value $\Delta T$ reaches or exceeds the preset temperature difference threshold $T_3$ (i.e., $\Delta T \geq T_3$), step S133a is executed to introduce a voltage of the output terminal of the thermo-electric conversion module; and when the temperature difference value $\Delta T$ is smaller than or does not reach the preset temperature difference threshold $T_3$ (i.e., $\Delta T < T_3$), step S133b is executed to stop introduction of the voltage of the output terminal of the thermo-electric conversion module.

Figure 3:
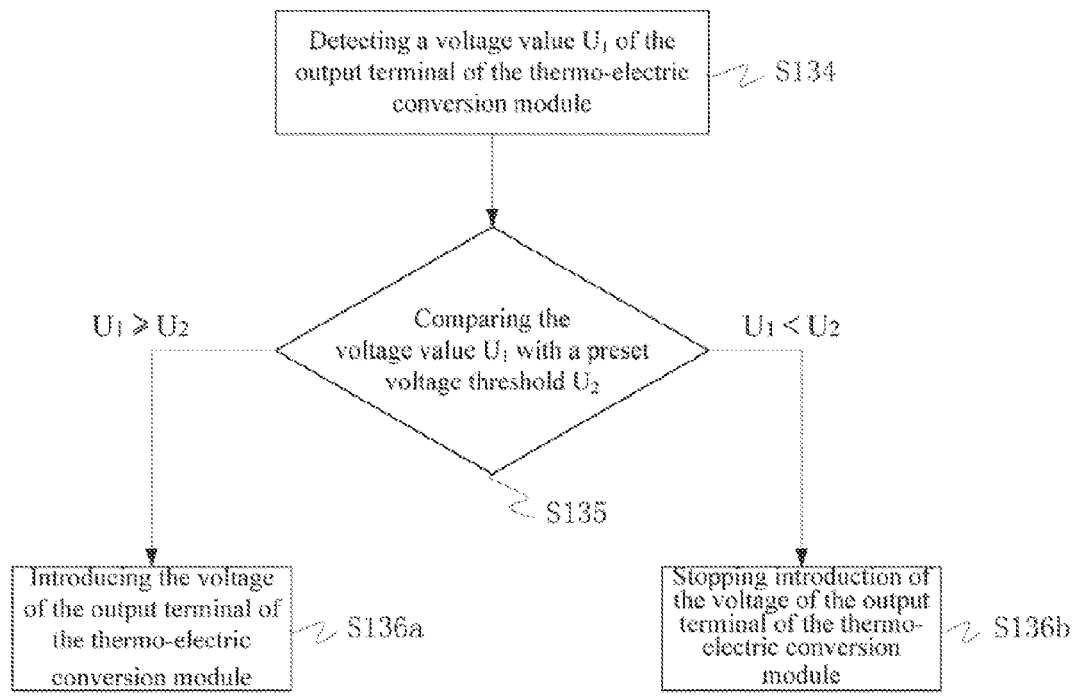
FIG. 3 is a flowchart diagram of detecting the voltage in the method of improving energy consumption efficiency in a mobile terminal according to the present disclosure.

(2) Voltage Detection as Shown in FIG. 3 step S134: detecting a voltage value $U_1$ of the output terminal of the thermo-electric conversion module;

step S135: comparing the detected voltage value $U_1$ with a preset voltage threshold $U_2$;

when the detected voltage value $U_1$ reaches or exceeds the preset voltage threshold $U_2$ (i.e., $U_1 > U_2$), step S136a is executed to introduce the voltage of the output terminal of the thermo-electric conversion module; and when the detected voltage value $U_1$ is smaller than or does not reach the preset voltage threshold $U_2$ (i.e., $U_1 < U_2$), step S136b is executed to stop introduction of the voltage of the output terminal of the thermo-electric conversion module.

To this end, the present disclosure proposes a mobile terminal with improved energy consumption efficiency, which comprises a circuit board and at least one power amplifier module electrically connected to the circuit board to amplify a communication signal of the mobile terminal. In one of implementations, the mobile terminal is further provided with a thermo-electric conversion module for absorbing heat energy generated by the power amplifier module and converting the heat energy into electric power. The thermo-electric conversion module is disposed inside the mobile terminal, and an output terminal of the thermo-electric conversion module is electrically connected to the circuit board to transmit the electric power obtained through conversion back to the circuit board.

Figure 5:
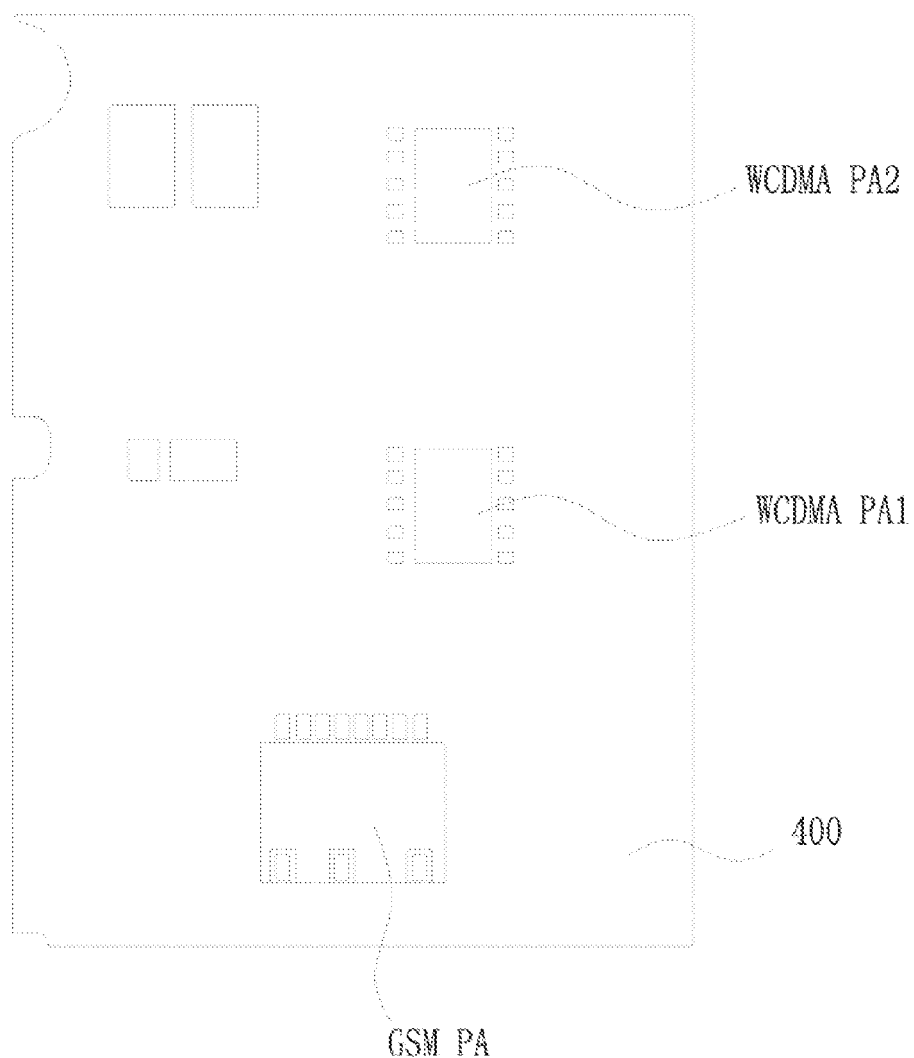
FIG. 5 is a schematic view illustrating a typical power amplifier circuit of the mobile terminal with improved energy consumption efficiency according to the present disclosure.

Specifically, as shown in FIG. 5, the at least one power amplifier includes one GSM PA power amplifier 401, one WCDMA PA1 power amplifier 402 and one WCDMA PA2 power amplifier 403, which are all located at a front surface

400a of the circuit board 400. An input terminal of the thermo-electric conversion module 410 comprises a high-temperature end 410a and a low-temperature end 410b. The high-temperature end 410a is located at a back surface 400b of the circuit board 400 and opposite to the power amplifiers 401, 402 and 403. For example, the high-temperature end 410a of the thermo-electric conversion module 410 may be closely attached on the back surface 400b of the circuit board 400. Because the circuit board 400 beneath the power amplifier 401, 402 or 403 is formed with many through holes 420 for assisting in heat dissipation, most of the heat energy generated by the power amplifier 401, 402 or 403 during operation can be transferred to the high-temperature end 410a of the thermo-electric conversion module 410 through heat radiation and/or heat convection via these through holes 420. Moreover, because the power amplifier 401, 402 or 403 makes contact with the front surface 400a of the circuit board 400 and the back surface 400b of the circuit board 400 makes contact with the high-temperature end 410a of the thermo-electric conversion module 410, a heat conduction effect is produced to cause the high-temperature end 410a of the thermo-electric conversion module 410 to rise in temperature rapidly and form a relatively large temperature difference from the low-temperature end 410b of the thermo-electric conversion module 410. Thereby, an electromotive force ϵ is generated at the output terminal of the thermo-electric conversion module consisting of two different kinds of semiconductor materials or the thermo-electric conversion module consisting of two different kinds of semiconductor materials connected with each other:

$$\epsilon = \alpha_s \times (T_2 - T_1) \qquad \text{Formula (1)}$$

In Formula (1), the unit of the electromotive force ϵ is V; $\alpha_s$ represents the Seebeck coefficient of the thermo-electric conversion semiconductor materials used, the unit of which is V/K; $T_1$ represents the temperature of the high-temperature end, the unit of which is K; and $T_2$ represents the temperature of the low-temperature end, the unit of which is K.

In practical applications, a thermo-electric conversion module may be formed by connecting multiple PN junctions in series. Now, such products have come into being, an example of which is a series of thermo-electric conversion module products produced by the Hi-Z company. The series of thermo-electric conversion modules can accomplish thermo-electric conversion effectively within the temperature range between −20° C. and 300° C., with an output power being up to 2.5 W to 19 W and a load voltage at the output terminal thereof ranging between 1.65 V and 3.30 V.

Figure 4:
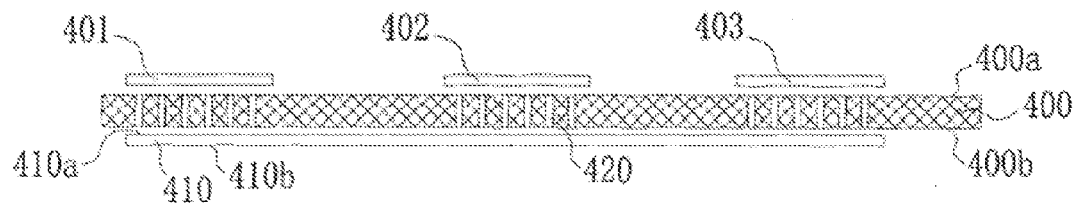
FIG. 4 is a structure view illustrating a stacked structure of a mobile terminal with improved energy consumption efficiency according to the present disclosure.

Hereinbelow, the mobile terminal of the present disclosure will be described by still taking the WCDMA terminal as an example. As shown in FIG. 5, the power amplifier circuit on the circuit board 400 of the WCDMA terminal comprises three power amplifiers, one of which is a GSM PA and the other two of which are a WCDMA PA1 and a WCDMA PA2. The PA, the PA1 and the PA2 are all disposed at a front surface of the circuit board 400, and disposing no components on a back surface of the circuit board 400 can achieve a better heat dissipation effect and a better EMC characteristic. The circuit board 400 further has multiple through holes 420 for heat dissipation formed beneath the PA, the PA1 or the PA2. As shown in FIG. 4, the circuit board 400 is provided with a thermo-electric conversion module 410 at the back surface 400b thereof. The thermo-electric conversion module 410 is in the form of a rectangular sheet, and has a high-temperature end 410a and a low-temperature end 410b on two surfaces thereof respectively. The high-temperature end 410a is closely attached on the back surface 400b of the circuit board 400, or is connected to the back surface 400b of the circuit board 400 through paste-like or elastic thermally conductive silica gel.

Figure 6:
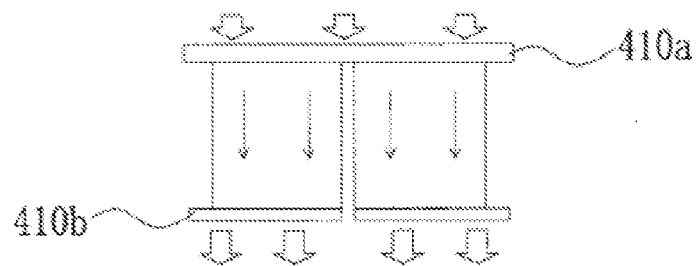
FIG. 6 is a schematic view illustrating the conversion principle of a thermo-electric conversion module used in the mobile terminal of the present disclosure.

The operating principle of the thermo-electric conversion module is as follows. When the WCDMA terminal is used for communication, the GSM PA or the WCDMA PA generates heat during operation. A portion of the heat is firstly transferred to the circuit board that is in contact with the GSM PA or the WCDMA PA, and is then transferred to the thermo-electric conversion module that is in contact with the circuit board; and another portion of the heat is transferred to the thermo-electric conversion module through heat convection and heat radiation at the heat dissipating through holes in the circuit board. The thermo-electric conversion module absorbs the heat energy generated by the PA during operation so that, as shown in FIG. 6, the high-temperature end 410a of the thermo-electric conversion module 410 rises in temperature and forms a temperature difference from the low-temperature end 410b of the thermo-electric conversion module 410. Thereby, an electromotive force is generated at the output terminal of the thermo-electric conversion module by means of the Seebeck effect of the semiconductors. The output terminal is connected to the circuit board of the WCDMA terminal, and may be connected to a recharging circuit of a battery of the WCDMA terminal to recharge the battery so that the energy consumption efficiency can be increased by recycling some of the electric power. Alternatively, the output terminal may also be directly connected to a power-consuming module (e.g., a light emitting diode (LED) lamp, a display panel, a touch screen, a Bluetooth device, an earphone etc.) of the WCDMA terminal simply by connecting the output terminal to a power supply circuit of the power-consuming module directly. This can also increase the energy consumption efficiency by saving the electric power of the battery. Meanwhile, this also reduces the temperature rise of the WCDMA terminal, reduces the impact of the high temperature on use of the WCDMA terminal, and reduces potential dangers of the high temperature to the battery of the WCDMA terminal so as to improve the safety of the battery.

As another implementation of the mobile terminal of the present disclosure, the thermo-electric conversion module may also be directly disposed on the power amplifier module. For example, the high-temperature end of the thermo-electric conversion module is disposed close to the power amplifier module, and the heat energy generated by the power amplifier module during operation is directly absorbed through heat conduction.

The mobile terminal with improved energy consumption efficiency of the present disclosure may further be implemented through combination of the aforesaid two implementations. That is, the thermo-electric conversion module is disposed at the back surface of the circuit board and at the front surface of the power amplifier module respectively to sufficiently absorb the heat generated by the power amplifier module so as to further increase the energy consumption efficiency of the mobile terminal.

Furthermore, the present disclosure further proposes a use of a thermo-electric conversion module. In one of implementations, the thermo-electric conversion module is disposed inside a mobile terminal to absorb heat energy generated by a power amplifier of the mobile terminal when amplifying a communication signal and to convert the heat energy into electric power; and an output terminal of the thermo-electric conversion module is electrically connected to a circuit board of the mobile terminal to output the electric power obtained through conversion to a recharging circuit or a power-consuming module of the mobile terminal. The power-consuming module includes an LED lamp, a display panel, a touch screen, a Bluetooth device, an earphone and so on, and it is only needed to directly output the electric power into a power supply circuit of the power-consuming module.

It shall be appreciated that, those of ordinary skill in the art may make modifications or alterations according to the above descriptions, and all of these modifications and alterations shall be covered within the scope of the appended claims of the present disclosure.

What is claimed is:

1. A method of improving energy consumption efficiency in a mobile terminal, comprising the following steps:
   A. a power amplifier module electrically connected to a circuit board of the mobile terminal amplifies a communication signal of the mobile terminal to generate heat energy;
   B. a thermo-electric conversion module, of which an output terminal is electrically connected to the circuit board, absorbs the heat energy generated by the power amplifier module during operation; and
   C. the thermo-electric conversion module converts the heat energy absorbed into electric power and output the electric power to the circuit board;
   wherein the step C further comprises an operation of detecting the temperature as follows:
   C1. detecting a temperature value of a high-temperature end of the thermo-electric conversion module and that of a low-temperature end of the thermo-electric conversion module respectively;
   C2. determining a temperature difference value between the temperature value of the high-temperature end and the temperature value of the low-temperature end; and
   C3. introducing a voltage of the output terminal of the thermo-electric conversion module when the temperature difference value reaches a preset temperature difference threshold.

2. The method of claim 1, wherein the step C further comprises:
   C4. detecting a voltage value of the output terminal of the thermo-electric conversion module;
   C5. comparing the detected voltage value with a preset voltage threshold; and
   C6. introducing the voltage of the output terminal of the thermo-electric conversion module when the detected voltage value reaches the preset voltage threshold.

3. The method of claim 1, wherein the output terminal of the thermo-electric conversion module is electrically connected to a recharging circuit of the circuit board to recharge a battery of the mobile terminal.

4. The method of claim 1, wherein the output terminal of the thermo-electric conversion module is electrically connected to a power supply circuit on the circuit board to power a power-consuming module of the mobile terminal.

5. A method of improving energy consumption efficiency in a mobile terminal, comprising the following steps:
   A. a power amplifier module electrically connected to a circuit board of the mobile terminal amplifies a communication signal of the mobile terminal to generate heat energy;
   B. a thermo-electric conversion module, of which an output terminal is electrically connected to the circuit board, absorbs the heat energy generated by the power amplifier module during operation; and
   C. the thermo-electric conversion module converts the heat energy absorbed into electric power and output the electric power to the circuit board;
   wherein the step C further comprises:
   C4. detecting a voltage value of the output terminal of the thermo-electric conversion module;
   C5. comparing the detected voltage value with a preset voltage threshold; and
   C6. introducing the voltage of the output terminal of the thermo-electric conversion module when the detected voltage value reaches the preset voltage threshold.

* * * * *